United States Patent
Steinkirchner et al.

(10) Patent No.: US 7,016,750 B2
(45) Date of Patent: Mar. 21, 2006

(54) METHOD, DEVICE, COMPUTER-READABLE STORAGE MEDIUM AND COMPUTER PROGRAM ELEMENT FOR MONITORING OF A MANUFACTURING PROCESS

(75) Inventors: Erwin Steinkirchner, Straubing (DE); Jörn Maeritz, Zeiler/Nittendorf (DE)

(73) Assignee: Infineon Technologies AG, (DE)

( * ) Notice: Subject to any disclaimer, the term of this patent is extended or adjusted under 35 U.S.C. 154(b) by 138 days.

(21) Appl. No.: 10/712,417

(22) Filed: Nov. 12, 2003

(65) Prior Publication Data
US 2004/0236528 A1  Nov. 25, 2004

(30) Foreign Application Priority Data
Nov. 12, 2002  (DE) .................................. 102 52 613

(51) Int. Cl.
*G06F 19/00*   (2006.01)
(52) U.S. Cl. ..................... 700/103; 700/108; 700/121
(58) Field of Classification Search ............... 700/100, 700/108, 101, 115, 103, 117, 121
See application file for complete search history.

(56) References Cited

U.S. PATENT DOCUMENTS

| 5,493,501 | A  | * | 2/1996  | Kondo .......................... 700/95 |
| 5,822,218 | A  | * | 10/1998 | Moosa et al. .................. 716/4 |
| 6,148,239 | A  |   | 11/2000 | Funk et al. |
| 6,346,426 | B1 | * | 2/2002  | Toprac et al. ................. 438/8 |
| 6,477,432 | B1 |   | 11/2002 | Chen et al. |
| 6,727,106 | B1 | * | 4/2004  | Ankutse et al. ................ 438/5 |

* cited by examiner

*Primary Examiner*—Jayprakash N. Gandhi
(74) *Attorney, Agent, or Firm*—Brinks Hofer Gilson & Lione

(57) ABSTRACT

In the case of a method for monitoring of a manufacturing process of a plurality of physical objects, several rules which relate to at least one status of at least one of the plurality of physical objects are stored. Furthermore, in the case of the method, a sample is selected from the plurality of physical objects by using the several rules, with physical objects of the sample being marked in such a way that they can be subjected to a measurement, the rules being formed on the basis of the criterion that the number of measurements is reduced and redundant measurements are avoided, and it being possible in the case of the method for the several rules to be combined with one another and checked against one another.

12 Claims, 4 Drawing Sheets

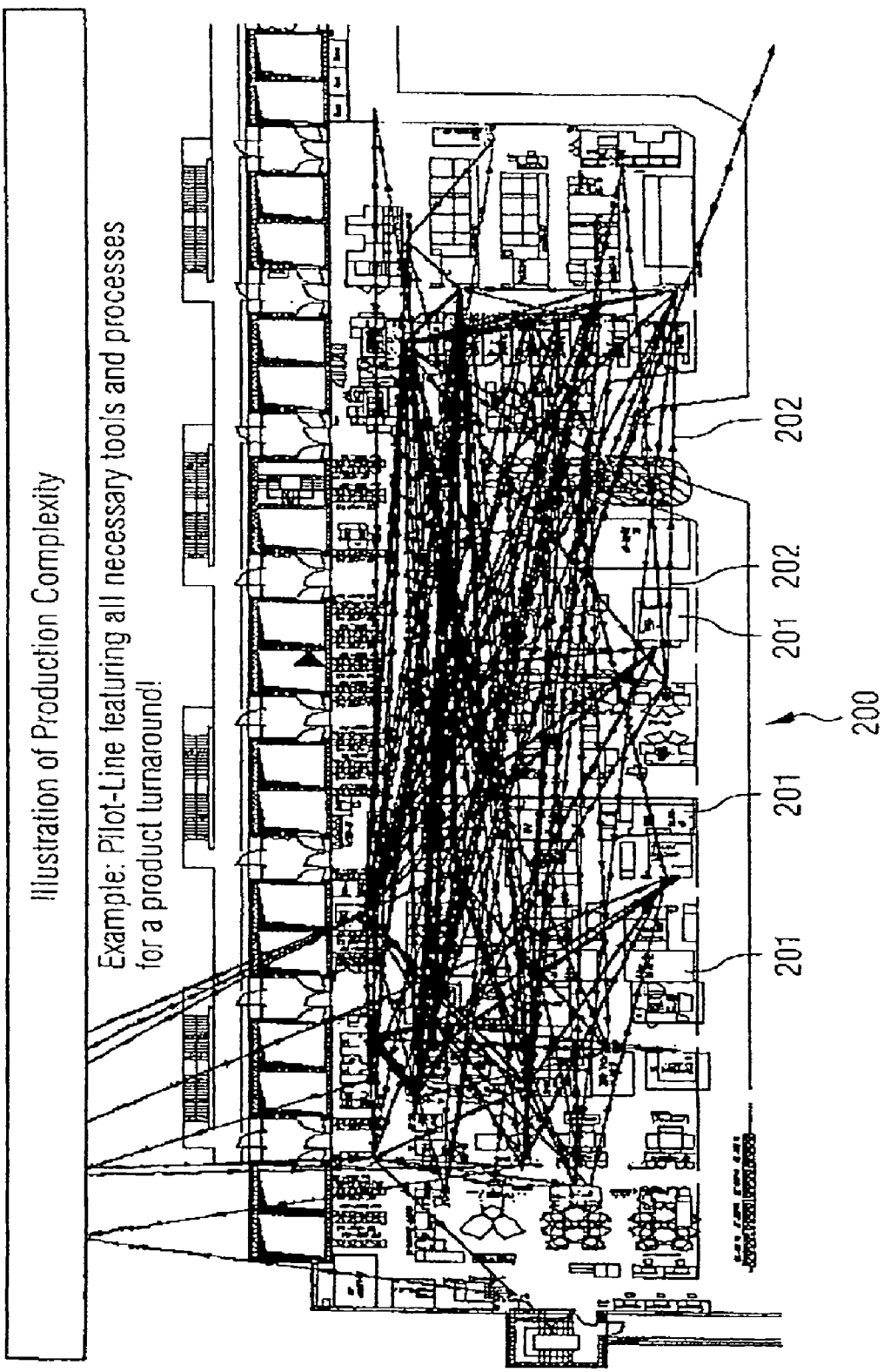

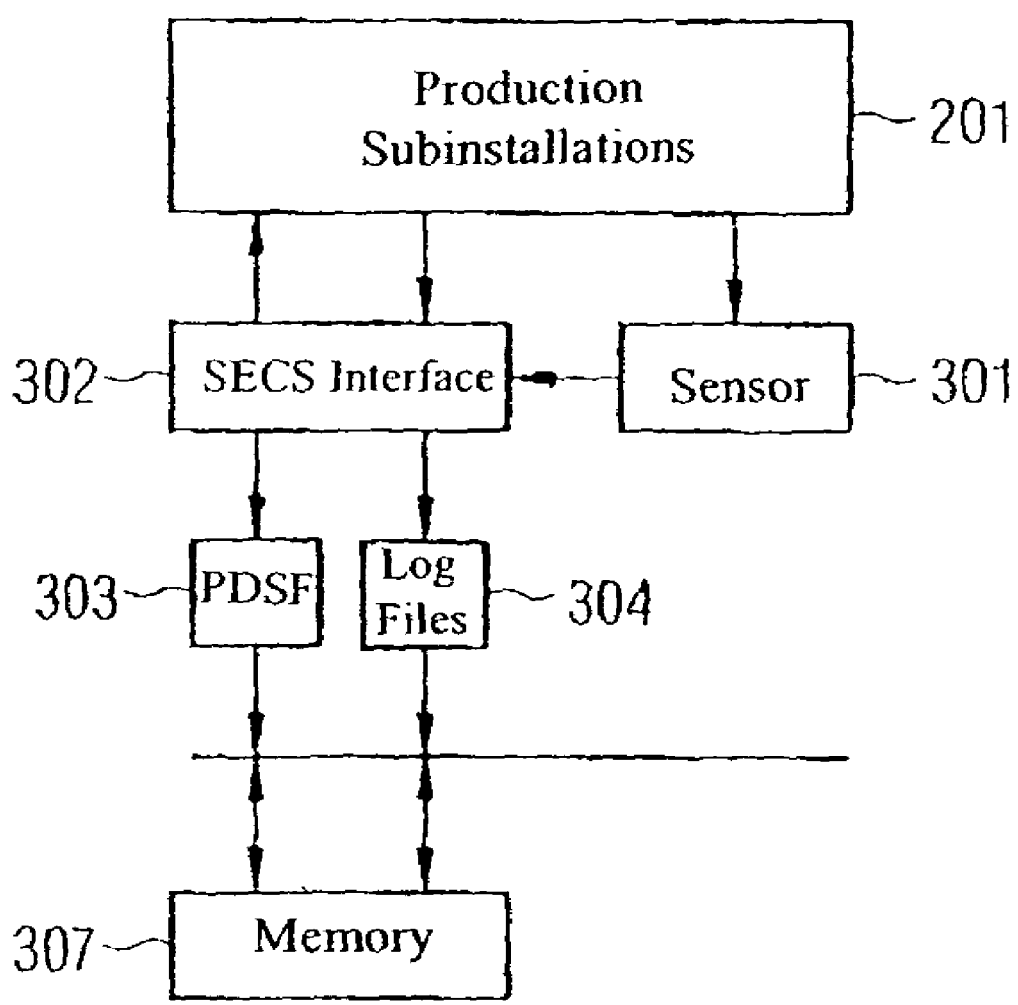

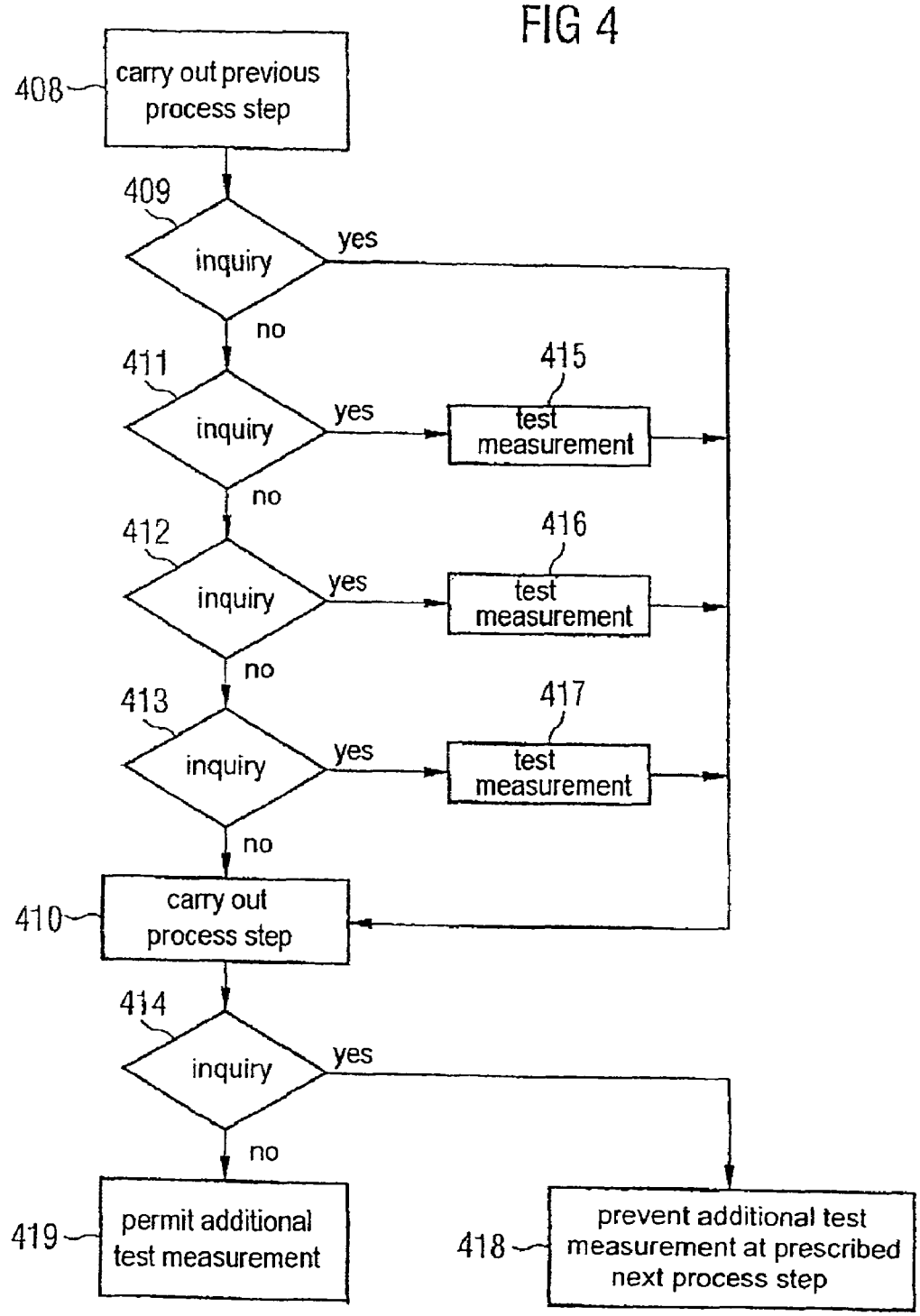

METHOD, DEVICE, COMPUTER-READABLE STORAGE MEDIUM AND COMPUTER PROGRAM ELEMENT FOR MONITORING OF A MANUFACTURING PROCESS

FIELD OF THE INVENTION

The invention relates to a method, a device, a computer-readable storage medium and a computer program element for monitoring of a manufacturing process.

BACKGROUND OF THE INVENTION

In the manufacture of Large Scale Integrated (LSI) semiconductor chips on wafers, the ever-increasing miniaturization of the structures on the semiconductor chip are responsible in particular for imposing ever greater requirements on the production installations and manufacturing processes used for the manufacture of the semiconductor chips. The stability and reproducibility both of the production installations and of the manufacturing processes decisively influence the yield and productivity during semiconductor chip production. Even small deviations from a set-behavior of a wafer production installation during production can lead to considerable worsening of the yield, that is to say to a considerable increase in the defect rate of the semiconductor chips manufactured.

Consequently, a major aspect in the manufacture of semiconductor chips is to detect possible deviations from a set-behavior in a chip production installation or during a manufacturing process at a very early time and to take corresponding countermeasures. Consequently, the analysis and monitoring of machines, in particular of the chip production installations, and of the manufacturing processes takes on very great commercial significance. Furthermore, the analysis and monitoring of many process steps of the manufacturing process is of considerable significance, since it is usually only rarely possible to repair an intermediate product after a process step has been carried out. A functional test of a manufactured semiconductor chip is generally not scheduled until right at the end of the manufacturing process, which leads to very late feedback into the manufacturing process of the results obtained.

It is further known to provide in-line measurements of interim process results, for example of the layer thicknesses, the layer resistance or of line widths, etc., by means of Statistical Process Control (SPC). However, this leads to additional measuring steps in the overall manufacturing process and is consequently time-consuming and costly.

In Advanced Process Control (APC), data from internal and external sensors of the production installations are analysed in combination with measuring techniques used, including in-line measured data on intermediate products, as well as results of measurements on test structures, once the wafer has been completely processed, results of functional tests on the semiconductor chips, the yield of defect-free semiconductor chips, etc. In this way, both the stability of the production installations and the process stability can be increased significantly, and in this way so the production productivity and the product quality of the semiconductor chips manufactured can be increased.

In general, the semiconductor chips are manufactured several at a time on so-called wafers. These wafers are in turn grouped into so-called lots, in which a multiplicity of individual wafers are logistically combined for further treatment of the wafers and subjected together to semiconductor process steps.

For in-line measurements of intermediate process results as part of SPC, selections of random samples of wafers of a lot are performed. Test measurements, which relate either to the quality of the manufacturing steps of a manufacturing process or to the quality of the products manufactured, are then carried out on the selected samples of wafers.

According to the prior art, the sample selection generally takes place by means of so-called hands-on rules, i.e. an explicit, precise individual rule is prescribed and used as a basis for carrying out the sample selection. This may take place either by means of handling instructions, i.e. instructions as to how for example entire product groups are to be handled, or by means of explicit stop instructions in the process schedule, which concern selected lots of wafers. The sample selection is carried out separately after individual process steps.

U.S. Pat. No. 6,477,432 discloses a system for administering the quality control in a production installation for processing lots of products in processing for at least one product, which system has a manufacturing process and a Statistical Process Control (SPC) analyser.

U.S. Pat. No. 6,148,239 discloses a process control system which uses feedforward control threads which are based on material groups and which uses material tracking to take into account the variability of the processing in a process sequence.

SUMMARY OF THE INVENTION

The present invention is based on the problem of simplifying monitoring of the manufacturing process and making the monitoring more robust with respect to errors, and at the same time also reducing the risk of redundancy in measurements.

The problem is solved by the method, the device, the computer-readable storage medium and the computer program element of the present invention for the monitoring of a manufacturing process with the features according to the independent patent claims.

In the case of a method for the monitoring of a manufacturing process of a plurality of physical objects, a number of rules are stored, which rules relate to at least one status of at least one of the plurality of physical objects. Furthermore, in the case of the method, a sample is selected from the plurality of physical objects by using the rules, with physical objects of the sample being marked in such a way that they can be subjected to a measurement, the rules being formed on the basis of the criterion that the number of measurements is reduced and redundant measurements are avoided, and wherein it is possible in the case of the method for the number of rules to be combined with one another and checked against one another.

The device for the monitoring of a manufacturing process of a physical object has at least one processor, which is set up in such a way that the method steps described above can be carried out.

In a computer-readable storage medium, a processing program for the monitoring of a manufacturing process of a physical object is stored, which processing program implements the method steps described above when it is run by a processor.

A computer program element for the monitoring of a manufacturing process of a physical object implements the method steps described above when it is run by a processor.

The invention can be realized both by means of a computer program, i.e. software, and by means of one or more special electrical circuits, i.e. in hardware, or in any desired hybrid form, i.e. by means of software components and hardware components.

Advantageously, the selection of lots which are subjected to sample investigation, of the number of wafers of a lot which are subjected to sample investigation, and possibly also the selection of individual wafers which are subjected to a test measurement for determining the quality of a production step, is automatically controlled by means of the rules. These rules may be influenced, and/or adapted to the respective circumstances, globally, i.e. for all lots of the same type together. This provides handling of the sample selection for the monitoring of the production process that is simpler and more resistant in respect of errors.

The invention can be advantageously used in particular during semiconductor production, i.e. for example in the manufacture of monocrystalline or polycrystalline silicon or some other semiconductor material, as well as semiconductor chip production, i.e. during the manufacture of semiconductor chips in a chip production installation. However, it should be pointed out in this connection that the invention can be advantageously used in any production process, in particular if many process steps which follow one after the other are necessary and the production process is to be inspected with regard to the quality of the production process and/or the quality of the products.

In the application, a status of a lot is understood as meaning a state of a lot, i.e. the value of a logistical parameter used for controlling further process steps, and consequently indicating how the lot is to be handled. For example, the status may be a value of a memory, the value being used as a means for correspondingly prescribing subsequent process steps.

A chip production installation is to be understood in this connection as meaning a system or an arrangement in which semiconductor components, in particular semiconductor chips, are produced by using different raw materials, for example by using semiconductor materials such as silicon as well as other main group W semiconductor materials (for example germanium) or binary, ternary as well as quaternary III-V compound semiconductor materials (for example indium-gallium-arsenide-phosphide, indium-gallium-arsenide-antimonide, etc.), or binary, ternary as well as quaternary II-VI compound semiconductor materials.

The semiconductor chip is to be understood in this description as meaning for example a memory chip, a microprocessor chip, a communication chip, a chip with an integrated semiconductor laser element, and also a chip optimized to a hardware function which can be predetermined as desired, such as for example a communication chip for the decoding of received radio signals or a chip for the processing of video signals.

The chip production installation has, according to the invention, several production sub-installations, for example different machines, with which the physical or chemical process steps necessary for the overall manufacturing process of a chip can be carried out.

An example in particular in the front-end area of chip production is that of devices for carrying out the following process steps:
a Rapid Thermal Processing Device (RTP device),
a furnace for heating up the wafers to be processed,
an etching device, for example a plasma-etching device, or a dry-etching device,
a lithographic device,
a wet-treatment device for etching, resist removal, cleaning or altering the product surface,
a CMP device, i.e. a device for carrying out chemical-mechanical polishing,
an ion-implantation device,
a depositing device for depositing layers on the wafer, for example a depositing device for Physical Vapor Deposition (PVD) or Chemical Vapor Deposition (CVD),
a measuring device for measuring predetermined wafer parameters or process parameters,
a testing device for testing wafers manufactured.

Depending on the product respectively to be manufactured, for example depending on the desired configuration of the chip to be produced, a multiplicity of different devices, that is to say production sub-installations, are provided in the chip production installation and coupled to one another to realize the respective necessary overall semiconductor chip production process.

It should be noted in this connection that the sequence of individual process steps in the respective production sub-installations can either be carried out "sequentially", i.e. always first in a first installation group A (for example resist coating) before a second installation group B (for example exposure) for two manufacturing steps which are to take place one after the other, or can be carried out "in parallel", i.e. in a first installation B1 (for example Scanner type XY100) or a second installation B2 (for example Stepper type Extra2000) for two different installations and processes which can alternatively carry out one and the same manufacturing step.

The physical object is preferably a wafer.

The invention is well-suited in particular in the case of wafer manufacture with its extremely high number of process steps, and consequently very high requirements on the accuracy of the setting of the process parameters, since monitoring of the product quality is realized in a simple way for the first time in this field. By means of the invention, the number of test measurements and the number of redundant measurements can be reduced.

One of the stored rules may relate to an SPC sampling status. This may preferably be an SPC sampling status such as, for example, "Every fourth lot of product A must be measured".

In an embodiment, a stored rule relates to an inquiry of a specific status of the lot, i.e. to a status which requires particular handling of the lot. This may be, for example, a so-called "blitz status", which has the consequence that the lot marked in this way is never measured.

According to one embodiment, a stored rule relates to an inquiry of an explicit status of the lot at a process step. Such an explicit status may be, for example, "measure lot at operation xxx" or "do not measure lot at operation xxx".

According to one embodiment, a stored rule relates to an inquiry of a sampling status of the lot, i.e. to a status which relates to previous process steps or measurements, for example a status "if a lot is not measured at operation xxx, then do not measure this lot at operation yyy either".

A stored rule may relate to an inquiry of a special monitoring status. Such a special monitoring status may be, for example, a status such as "of product A, always measure 3 wafers with program nnn at operation xxx".

The various stored rules are preferably combined with one another, i.e. they influence one another and/or are being checked against one another.

Furthermore, the marked physical objects are preferably subjected to a measurement.

The invention can illustratively be seen in creating an automated selection of samples by means of methodical application of rules. Various types of rules can be stored, for example so-called hands-on rules, i.e. rules which are explicit individual instructions, or automatic rules, i.e. rules such as for example "If measurement A has taken place on a lot, then also carry out measurement B on this lot". By means of a method according to the invention, an automatic set of rules, i.e. a list of several rules that influence one another, is created. This automatic set of rules is of a flexible construction and, if the manufacturing process or the monitoring of the manufacturing process so requires, can be extended without any problems.

By means of the invention, a set of selection rules is created, providing a selection of samples for test measurements of a monitoring of the manufacturing process. The selection of lots, of the number of wafers which are to be measured, and possibly the wafer numbers, is automatically controlled. The rules are influenced or adapted globally, i.e. for different production steps at the same time and not separately for each individual process step. Various rules are checked against one another, so that redundant measurements cannot occur, i.e. the number of costly and time-intensive measurements is reduced. In addition, it is prevented by means of checking the rules against one another that measurements are not carried out, i.e. it is not possible for measurements to be forgotten and thus it is not possible that necessary product monitoring of the individual wafers is not carried out.

The set of rules preferably has a minimum set of five types of rule, of which one type of rule relates to an inquiry of an SPC sampling status, one type of rule relates to an inquiry of a lot status, one type of rule relates to an inquiry of an explicit lot status at an operation, one type of rule relates to an inquiry of the sampling status of a lot and one type of rule relates to an inquiry of a special monitoring status.

Even though the invention is explained in more detail below on the basis of the example of a monitoring method of a wafer manufacturing process, it is pointed out that the invention is not restricted to this but instead can be used in all monitoring methods for manufacturing processes in which process parameters are recorded in the manufacturing process for manufacturing a physical object, for example also in the pharmaceuticals industry in the manufacture of pharmaceutical products.

BRIEF DESCRIPTION OF THE DRAWINGS

An exemplary embodiment of the invention is explained in more detail below and represented in the figures, in which:

FIG. 2 shows a diagram of a chip production installation, with the complex material flow, i.e. the path of a wafer/lot, through the chip production installation and the associated complex process steps being represented;

FIG. 3 shows a block diagram in which the process data flow when producing a wafer/lot is represented; and FIG. 4 shows a schematic program flowchart of a method according to an exemplary embodiment of the invention.

DETAILED DESCRIPTION OF THE DRAWINGS

Figure 1:
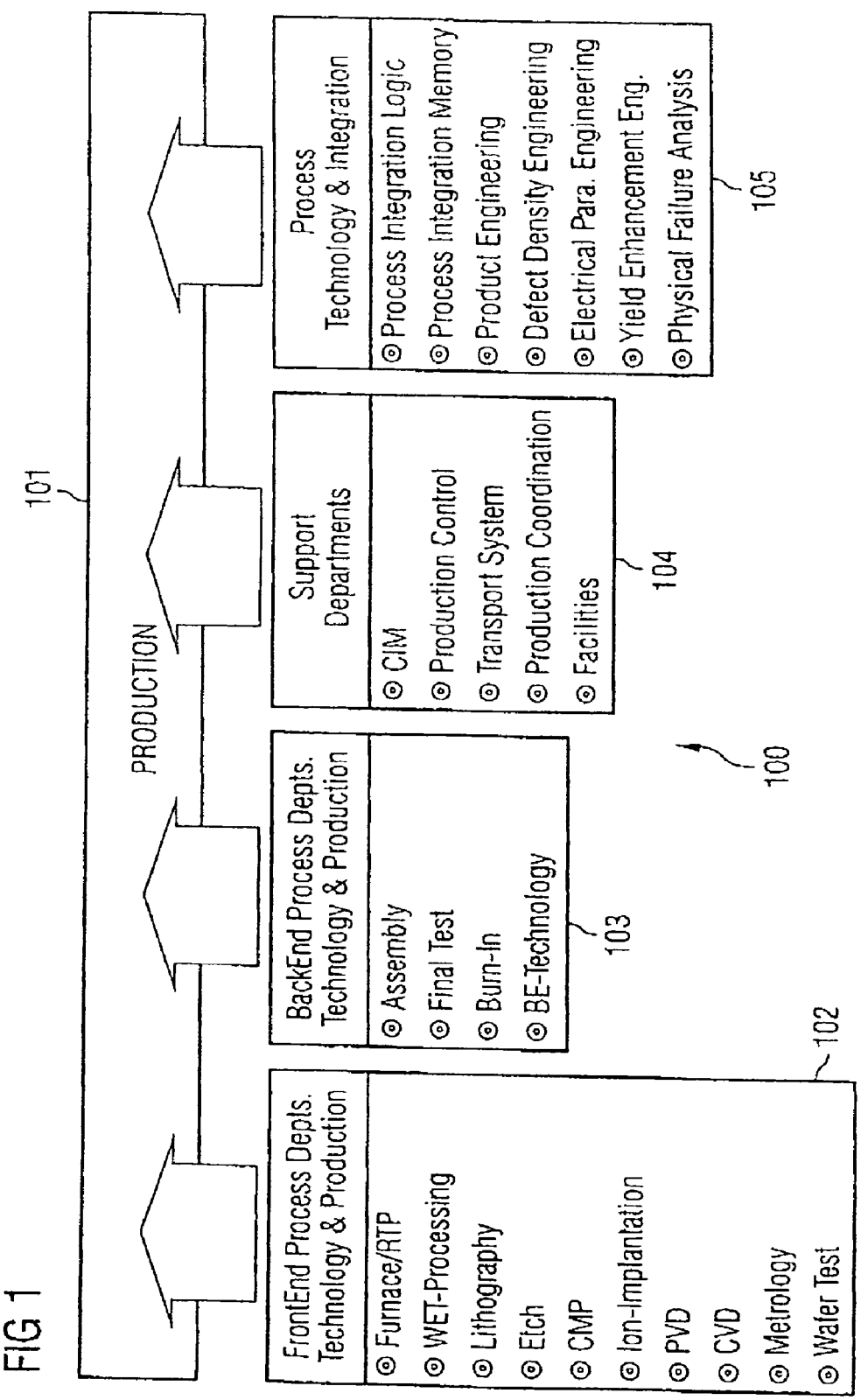
FIG. 1 shows a block diagram in which the general organization of a chip production installation is represented.

By way of introduction, FIG. 1 schematically illustrates in a block diagram 100 the organization and setup of a semiconductor chip production installation, for which a method according to the invention can be used for the monitoring of a manufacturing process of a plurality of wafers, on which wafers the semiconductor chips are arranged.

The overall manufacturing process, referred to in FIG. 1 by a first block 101, is grouped by way of example into four production areas 102, 103, 104, 105, a first area, into which the front-end processes of the chip production are grouped (block 102), a second area of the manufacturing process, into which the back-end processes are grouped (block 103), a third area of the manufacturing process, which relates to the support, that is to say the backup, of the individual manufacturing processes (block 104), a fourth area, which relates to the process technology and the process integration (block 105).

In the case of the front-end processes 102, the following process technologies and the devices set up for carrying out the corresponding processes are provided in particular:

a furnace for heating up the respective wafer to be processed;

a device for carrying out Rapid Thermal Processing (RTP);

a device for etching the wafer, for example for wet-etching or for dry-etching;

a device for cleaning, for example washing, the wafer;

a device for carrying out various lithographic steps;

a device for chemical-mechanical polishing (CMP);

a device for carrying out an ion-implantation in predetermined areas of the wafer or of the chip respectively to be produced;

devices for applying materials to the wafer, for example devices for depositing materials from the vapor phase, that is for example devices for carrying out Physical Vapor Deposition (PVD) or Chemical Vapor Deposition (CDV), or a device for epitaxially growing material on a substrate;

metrology devices, i.e. measuring devices, devices for carrying out tests on the respective wafers.

The back-end processes relate in particular to the following areas:

the assembly of the chips in housings;

the final test of the finished and housed chip;

the introduction of information, for example product information, into or onto the housing of the respective chip; and also generally the technologies used in the back-end area for housed and unhoused chips.

The support, that is to say the process backup, relates in particular to the following areas:

CIM;

process control;

the transportation system for delivering the finished semiconductor chips;

coordination of production; and backup for the respective production sites.

Process technology and process integration relates in particular to:

the process integration of logic modules;

the process integration of memory modules;

product engineering;

the monitoring and improving of defect densities in manufacture;

the monitoring of electrical parameters in the products manufactured;

enhancement of the yield of the chips manufactured; and a physical failure analysis.

FIG. 2 shows a semiconductor chip production installation, in other words a semiconductor chip factory 200, with a multiplicity of semiconductor chip production sub-installations 201, which are used for processing raw materials, for example a silicon wafer or a wafer made of other semiconductor materials (germanium, gallium-arsenide, indium-phosphide, etc.), in order to produce semiconductor chips from the raw materials.

A customary manufacturing process for manufacturing a semiconductor chip has hundreds of different process steps, in which lithographic steps, etching steps, CMP steps, steps for applying materials to the respective wafer to be processed, as well as steps for doping or implanting doping atoms in the wafer to be processed are carried out in various sequences.

This results in the paths represented in FIG. 2 by lines 202, which represent the path of a wafer or lot of wafers through the semiconductor chip production installation 200. In the semiconductor chip production installation 200 there are a multiplicity of sensors, which are assigned to the respective sub-production installations 201 and an even greater amount of process data, which are respectively acquired by the sensors, are recorded. A respective sensor may be integrated into a respective machine (integrated sensor) or be attached separately to a respective machine (external sensor).

Hereafter, the production sub-installations 201 are also referred to as machines 201.

FIG. 3 shows by way of example the data flow for process data, which are acquired on a machine 201 by means of an integrated sensor or by means of an external sensor 301. Each sensor 301, it being possible for any desired number of integrated and/or external sensors to be provided, acquires the parameters of the machine 201 which are respectively predetermined for it (e.g. physical or chemical states in a process chamber, the position of a robot arm, etc.). Examples of process parameters in the manufacture of a wafer are the misalignment, i.e. the positioning inaccuracy, within a positioning step, the temperature during a process step, the gas flow during a process step, the time duration of a process step or the pressure during a process step.

The sensor 301 is coupled via a SEMI Equipment Communication Standard (SECS) interface 302, which is set up for data communication according to the SECS standards, to a local communication network (Local Area Network, LAN) (not shown).

According to the SECS standards, files are generated by the sensor 301 and the SECS interface 302 according to the PDSF format (Process Data Standard Format), also referred to hereafter as PDSF files 303 and also log files 304. The PDSF files 303 and the log files 304 are preferably stored as data in a memory 307.

The PDSF files 303 contain, for example, analog data from different channels, that is to say from different internal (i.e. integrated) and/or external sensors 301, which may be attached to a machine 201. The process data generated are stored in the memory 307.

A schematic flowchart of a method for the monitoring of such a manufacturing process according to an exemplary embodiment of the invention is then given in FIG. 4.

The evaluation of the generated process data and/or other data, such as for example status information of individual lots of wafers, for the monitoring of the manufacturing process is carried out by means of a control computer.

Starting out from a previous operation or a previous processing step 408 in the manufacturing process described above, according to an exemplary embodiment of the invention, the automatic rules of the sample selection are run through in the flowchart. For this purpose, the recorded and stored information are evaluated according to predetermined rules by means of the control computer for the individual wafers or lots of wafers. In the evaluation by means of the control computer, the sample selection is carried out on the basis of the stored information, i.e. process data, or status information stored for an individual wafer or a lot of wafers.

A first rule 409, on the basis of which a sample selection is made, by means of the control computer, for test measurements on wafers or lots of wafers manufactured by means of the manufacturing process described above, relates to the inquiry of a lot status, i.e. a status in which a variable which is allocated to the lot has a predetermined value. In the exemplary embodiment, this is a "blitz status", i.e. a lot status in the case of which no measurements are carried out on this lot. The lot is passed on immediately to the next step 410 of the manufacturing process.

According to the flowchart, a second rule 411 of the set of rules is checked. The second rule 411 is an inquiry of a sampling status of the lot. This is understood for example as meaning a status of the lot that, in a general rule, every fourth lot of a specific product A is measured by means of a test measurement. On the basis of the result of the inquiry, the lot is automatically passed on to the next operation. In the case that the lot is, for example, a respective fourth lot, it is subjected to a test measurement 415 and a decision is taken on the basis of the result of this test measurement 415 as to how the lot is to be further treated. It may be re-incorporated in the normal manufacturing process, i.e. passed on to process step 410. It may, however, also be subjected to re-working or be outsorted. If the lot is not the fourth lot, it is further processed without corresponding test measurement, i.e. a next inquiry of the status of the lot is carried out.

A third rule 412, to which the lot is subjected, relates to an inquiry of an explicit lot status of the lot at the operation 408. This may be, for example, a status that the specific lot is to be measured at specific operation 408. If such a status exists, the lot is subjected to a test measurement 416 and a decision is taken on the basis of the result of this test measurement 416 as to how the lot is to be further treated. It may be re-incorporated in the normal manufacturing process, i.e. be passed on to process step 410. It may, however, also be subjected to re-working or be outsorted. If the lot does not have a corresponding explicit lot status, it is further processed without corresponding test measurement, i.e. a next inquiry of the status of the lot is carried out.

A fourth rule 413 to which the lot is subjected relates to an inquiry of a special control status. This may be, for example, a rule which has the effect that, from each lot of the product A at operation 408, three wafers are always subjected to a test measurement 417 by means of a specific program. On the basis of the result of this test measurement 417, a decision is taken as to how the lot concerned is to be further treated. It may be re-incorporated in the normal manufacturing process, i.e. passed on to process step 410. It may, however, also be subjected to re-working or be outsorted. If the lot does not have a corresponding special control status, it is further processed without corresponding test measurement, i.e. passed on to process step 410.

In the exemplary embodiment, after executing the four rules described, which correspond to four different types of rule, the next operation (i.e. processing step) 410 is carried out. After this next processing step 410, also an additional type of inquiry is carried out in addition to the types of inquiry already described above, which are not described again here. The additional type of inquiry also relates to the sampling status of the lot, i.e. to the fact whether this lot was selected as a sample for test measurements. A fifth rule 414 may be, for example, an inquiry such as "If the lot concerned was not measured at operation 408, do not measure this lot at operation 410 either". If this is the case, the further inquiries after process step 410 are not carried out for the lot concerned and the lot is further processed directly.

In other words, if in the exemplary embodiment the evaluation of the inquiry 414 gives a "yes", i.e. the lot concerned was not subjected to a test measurement at the operation 408, step 418 follows as a consequence of the evaluation, i.e. at the prescribed next process step an additional test measurement is prevented for the lot concerned.

If in the exemplary embodiment the evaluation of the inquiry 414 gives a "no", i.e. the lot concerned was subjected to a test measurement at the operation 408, step 419 follows as a consequence of the evaluation, i.e. an additional test measurement is permitted for the lot concerned.

The additional type of inquiry, as realized in the fifth inquiry, is preferably suitable for influencing the sample selection if results of a test measurement can only be evaluated in connection with the results of a previous test measurement, i.e. a test measurement which was carried out after a previous processing step.

The schematic flowchart of the method according to the invention, shown in FIG. 4, is to be understood in the sense that the evaluation can be carried out by the control computer after each process step. That is to say that, after the step 419, inquiries of the type represented in step 409, 411, 412 and 413 can be carried out again. In FIG. 4, only part of the method for the monitoring of a manufacturing process is schematically represented, which part can be carried out after each processing step of the manufacturing process.

In the exemplary embodiment described there are at least five rules. The five rules described above characterize five types of rules. Further rules or types of rules can be added. However, the minimum set of types of rules is five. Depending on the result of the inquiries, the lots are automatically passed on to the corresponding operation, which is to be performed on the corresponding lot, i.e. they are either subjected to a measurement for monitoring the manufacturing process and/or the production quality, or the lot runs through the further manufacturing process without measurement at this operation.

The sequence schematically represented in FIG. 4 is only an exemplary embodiment. Alternatively, once test measurements have been carried out on it, instead of being further processed, i.e. in the above example passed on to process step 410, the lot may also be subjected to the inquiries still outstanding. That is to say that a lot which was subjected to a test measurement 415 after inquiry 411 may also be subjected to the inquiry 412 and/or 413 after the test measurement 415, instead of being passed on directly to process step 410 in the way described above.

To sum up, the invention provides a method for the monitoring of a manufacturing process in which a sample selection is carried out by means of an automatic set of rules. The sample selection is not made as in the prior art by means of handling instructions, for example instructions for entire product groups, or by explicit stops, for example for selected lots, but instead a set of rules in which the rules can be globally influenced and/or adapted is set up. By means of the set of rules, the selection of lots, the number of wafers and maybe wafer numbers is automatically carried out. The various rules of the set of rules are checked against one another, so that redundant messages or skipped messages, i.e. messages which are inadvertently not carried out, do not occur. A minimum set of rules has five different types of rule. However, this minimum set can be extended as required.

What is claimed is:

1. A method for computer-controlled monitoring of a manufacturing process of a plurality of physical objects, said method comprising the steps of:
   providing at least one rule stored in a control computer, each of the at least one rule relating to at least one status of at least one of the plurality of physical objects;
   evaluating the plurality of physical objects based on the at least one rule to select a sample of the plurality of physical objects;
   marking the sample of the plurality of physical objects in such a way that the sample can be subjected to a measurement; and
   determining whether to perform further measurements on the sample based on the criterion of reducing the number of measurements and avoiding redundant measurements.

2. The method as claimed in claim 1, wherein the physical object is a wafer.

3. The method of claim 2, wherein one of the at least one rule relates to a Statistical Process Control ("SPC") sampling status of the plurality of physical objects.

4. The method of claim 2, wherein one of the at least one rule relates to an inquiry of a specific status of the plurality of physical objects.

5. The method of claim 2, wherein one of the at least one rule relates to an inquiry of an explicit status of the plurality of physical objects at a process step.

6. The method of claim 2, wherein one of the at least one rule relates to an inquiry of a sampling status of the plurality of physical objects.

7. The method of claim 2, wherein one of the at least one rule relates to an inquiry of a special monitoring status of the plurality of physical objects.

8. The method of claim 1, further comprising:
   combining each of the at least one rule into a single rule.

9. The method of claim 1, further comprising:
   measuring the marked sample of the plurality of physical objects.

10. A device for computer-controlled monitoring of a manufacturing process of a plurality of physical objects with a processor which is set up in such a way that the following method steps can be carried out:
    providing at least one rule relating to at least one status of at least one of the plurality of physical objects;
    evaluating the plurality of physical objects based on the at least one rule to select a sample of the plurality of objects;
    marking the sample of the plurality of physical objects in such a way that the sample can be subjected to a measurement; and
    determining whether to perform further measurements on the sample based on a criterion of reducing the number of measurements and avoiding redundant measurements.

11. A computer-readable storage medium, in which a program for monitoring of a manufacturing process of a plurality of physical objects is stored, the program executes the following method steps when it is run by a processor:
    providing at least one rule relating to at least one status of at least one of the plurality of physical objects;
    evaluating the plurality of physical objects based on the at least one rule to select a sample of the plurality of objects;

marking the sample of the plurality of physical objects in such a way that the sample can be subjected to a measurement; and determining whether to perform further measurements on the sample based on a criterion of reducing the number of measurements and avoiding redundant measurements.

12. A computer program element for monitoring of a manufacturing process of a plurality of physical objects which executes the following method steps when it is run by a processor:

providing at least one rule relating to at least one status of at least one of the plurality of physical objects;

evaluating the plurality of physical objects based on the at least one rule to select a sample of the plurality of objects;

marking the sample of the plurality of physical objects in such a way that the sample can be subjected to a measurement; and determining whether to perform further measurements on the sample based on a criterion of reducing the number of measurements and avoiding redundant measurements.

* * * * *